(12) United States Patent
Kramer et al.

(10) Patent No.: US 6,827,135 B1
(45) Date of Patent: Dec. 7, 2004

(54) HIGH FLUX HEAT REMOVAL SYSTEM USING JET IMPINGEMENT OF WATER AT SUBATMOSPHERIC PRESSURE

(76) Inventors: Gary W. Kramer, 13735 Moss Rock, Auburn, CA (US) 95602; Richard S. Frankel, 230 Josselyn La., Woodside, CA (US) 94062

( * ) Notice: Subject to any disclaimer, the term of this patent is extended or adjusted under 35 U.S.C. 154(b) by 0 days.

(21) Appl. No.: 10/460,547

(22) Filed: Jun. 12, 2003

(51) Int. Cl.[7] .............................................. F28D 15/00
(52) U.S. Cl. ........................... 165/104.27; 165/104.33; 165/80.4; 361/699; 257/714; 174/15.1
(58) Field of Search .............................. 165/80.4, 185, 165/104.21, 104.33, 908; 361/699; 257/714; 174/15.1

(56) References Cited

U.S. PATENT DOCUMENTS

| | | | | |
|---|---|---|---|---|
| 1,145 A | * | 5/1839 | Anderson ................... | 105/166 |
| 4,955,361 A | * | 9/1990 | Sotani et al. ............. | 126/351.1 |
| 4,967,829 A | * | 11/1990 | Albers et al. ............. | 165/109.1 |
| 5,522,452 A | * | 6/1996 | Mizuno et al. ............. | 165/286 |
| 5,924,482 A | * | 7/1999 | Edwards et al. ........ | 165/104.33 |
| 6,431,260 B1 | * | 8/2002 | Agonafer et al. ........... | 165/80.4 |

* cited by examiner

*Primary Examiner*—Terrell Mckinnon
(74) *Attorney, Agent, or Firm*—Russo & Hale LLP; William C. Milks, III

(57) ABSTRACT

A cooling system for apparatus powered by electricity, that generates a substantial amount of heat during operation, and the heat must be dissipated to avoid failure of electrical and/or electronic components, such as semiconductor devices and integrated circuits, comprising the electrical apparatus. The cooling system employs water impinged on a heat sink thermally coupled with electrical apparatus, at subatmospheric pressure. The attendant phase change of the water to steam at a reduced temperature due to the subatmospheric pressure improves removal of waste heat to prevent failure of the electrical apparatus.

14 Claims, 1 Drawing Sheet

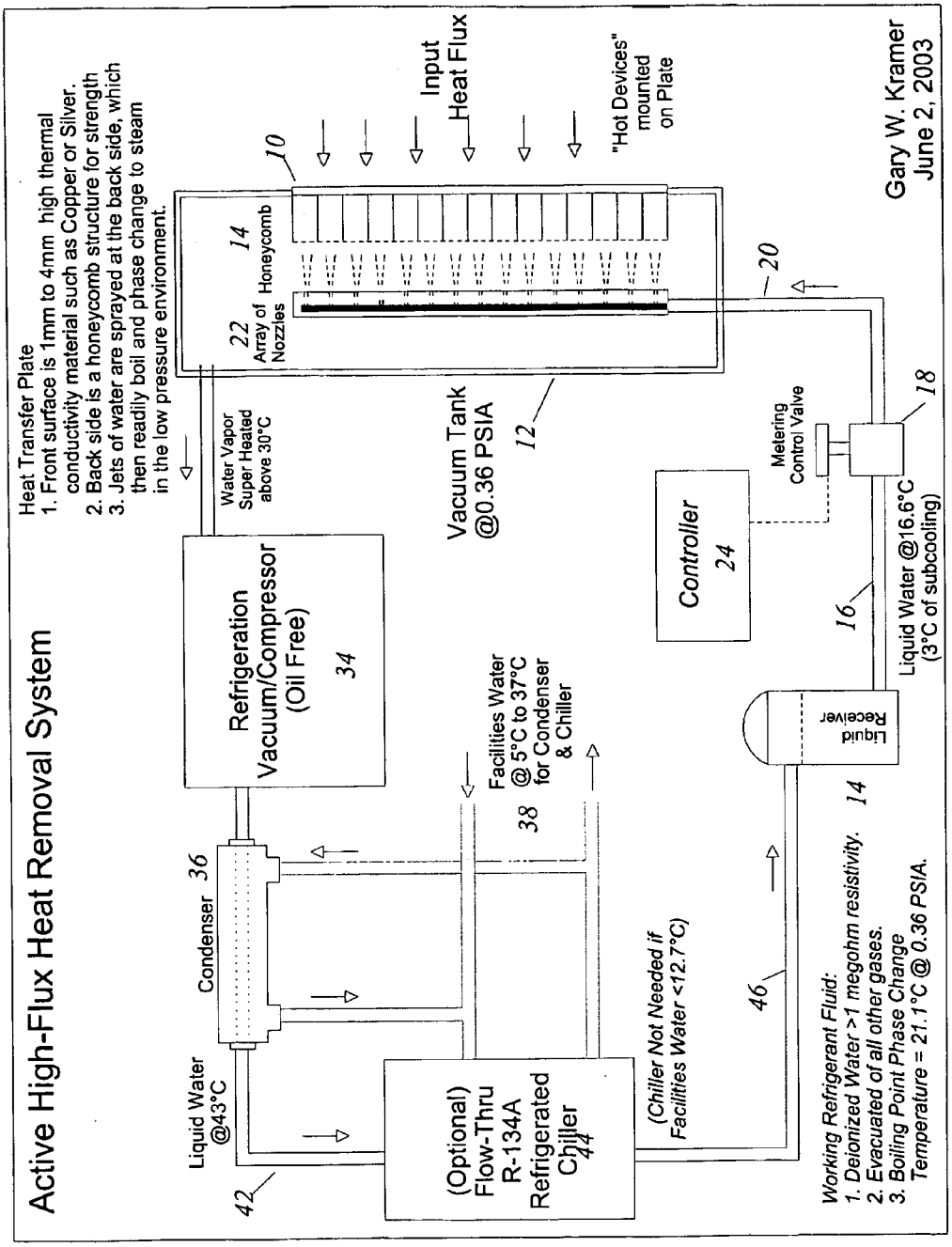

HIGH FLUX HEAT REMOVAL SYSTEM USING JET IMPINGEMENT OF WATER AT SUBATMOSPHERIC PRESSURE

BACKGROUND OF THE INVENTION

1. Field of the Invention

The present invention relates to cooling systems and, more particularly, to cooling systems for electrical apparatus. Generally, the present invention provides a cooling system for apparatus powered by electricity, that generates a substantial amount of heat during operation, and the heat must be dissipated to avoid failure of electrical and/or electronic components, such as semiconductor devices and integrated circuits, comprising the electrical apparatus. Specifically, one embodiment of the present invention provides a cooling system preferably employing water jet impinged in a partial vacuum on a heat sink thermally coupled to electrical apparatus, and the attendant phase change of the water to steam at the reduced boiling point due to the subatmospheric pressure, to remove a substantial amount of waste heat to prevent failure of the electrical apparatus.

2. Description of the Prior Art

Cooling is an important process associated with operation of high-density electronic devices. Existing waste heat removal technology is limited to approximately 100 W/cm$^2$.

In the next ten years, the power density of high-power electronics is expected to increase and generate waste heat that will exceed 1,000 W/cm$^2$. Thermal management technology capable of removing waste heat of 1,000 W/cm$^2$ produced by advanced power electronic devices is needed.

For example, the U.S. Department of Navy has reported that the cooling requirements are expected to increase at least an order of magnitude during the next decade. As stated in "Next Generation Navy Thermal Management Program," CARDIVNSWC-TR-82-2002/12, by Michael Kuszewski and Mark Zerby, Naval Surface Warfare Center:

"It is expected that heat fluxes for new technologies such as Advanced Radar will exceed 1000 W/cm$^2$, and some advanced weapons may be higher. These heat fluxes are expected to be present by the end of this decade. Heat fluxes are growing so fast in the electronics arena that even Intel, who has been designing its Thermal Management Systems to handle less than 100 W/cm$^2$, has extrapolated its increase of heat flux to reach 1000 W/cm$^2$ before the end of this decade."

Accordingly, the U.S. Navy recently published RFQ N03-T022 Acquisition Program: DD(X); CVN(X) having the:

"OBJECTIVE: To develop advanced thermal management technologies to improve high flux waste heat removal by a factor of 10×over existing technologies in electronic devices."

Also,

"The proposed solution must be able to keep the semiconductor junction below 125 F [sic, 125 C] . . . "

Spray cooling with water at atmospheric pressure is a known cooling technique to remove heat from electronics relatively efficiently. See, Kuszewski and Zerby, supra. In situations where cooling very hot surfaces or protecting sensitive surfaces from overheating is important, then the most effective previously known technique available is direct impact by impingement jets (not necessarily sprays) at atmospheric pressure. The reverse side of a mounting plate, on which the electronic devices are disposed, is sprayed by high velocity impinging jets of water. The heat generated by the electronics is removed at constant temperature by the liquid vapor phase of the water.

The heat transfer processes involved in water sprays impinging on hot surfaces at atmospheric pressure have been studied by, among others, Bernardin J D, and Mudawar I, "Film boiling heat transfer of droplet streams and sprays," *Intl. J. Heat Mass Transfer*, 40 (11), 2579–2593 (1997). Rockwell has also published a paper that reports having achieved removal of 1,000 W/cm$^2$ using a water jet plus boiling at atmospheric pressure. However, Rockwell was only able to cool a very small area (unspecified).

Additionally, it has been reported that heat pipes using water have removed 550 W/cm$^2$ over small areas to provide waste heat removal from hot electronic components. See, Kuszewski and Zerby, supra. The heat pipes were used to transport and spread waste heat. The heat pipes were operated at 70° C. (at pressure below one atmosphere) to accomplish a change in phase. However, heat pipes are passive; that is, they employ the capillary action of water in conjunction with wicks to transport water. Consequently, heat pipes cannot remove large amounts of waste heat on the order of 1,000 W/cm$^2$.

The challenge presented by the need to conduct waste heat from electronic devices efficiently and to provide removal of waste heat on the order of 1,000 W/cm$^2$ at a rate that will maintain the operating temperature of electronic devices at or below 125° C. is imposing. The 125° C. limit requires efficient heat transfer to sink heat away from the electronic apparatus. The high heat flux (1,000 W/cm$^2$) further requires an effective heat removal process to maintain the operating temperature of electronic devices at or below the 125° C. limit.

It would therefore be desirable to provide removal of waste heat from electronic devices to maintain the operating temperature of electronic devices at or below 125° C. It would also be desirable to remove waste heat at a rate to prevent the operating temperature of electronic devices from exceeding the 125° C. limit. Furthermore, it would be desirable to achieve these objectives for electrical apparatus that generates waste heat on the order of 1,000 W/cm$^2$. Additionally, it would be desirable to use water as the coolant.

SUMMARY OF THE INVENTION

One embodiment of the present invention provides a cooling system for thermally conducting and removing high heat flux waste heat using water. The cooling system in accordance with one embodiment of the present invention employs jet impingement of water at a predetermined reduced pressure to improve high heat flux waste heat removal by a factor of ten times over present cooling techniques. One embodiment of the cooling system in accordance with the present invention is especially suitable to the challenge of removing high heat flux waste heat resulting from operation of power electronics given the severe limitation on the maximum operating temperature allowable for electronic devices.

One preferred embodiment of the cooling system in accordance with the present invention provides a heat transfer plate consisting of copper, aluminum, silver, or another suitable thermally conductive material, such as beryllium oxide ceramic, boron nitride, aluminum nitride ceramic, or diamond, with high tensile strength, thermally coupled, for example, in thermal contact with, the electrical apparatus. The heat transfer plate also serves as a structural component of a circulation subsystem that contains the water.

The circulation subsystem comprises compressors, condensers, and pumps to circulate water to the location where the water is jet impinged on the heat transfer plate, as well as to remove and condense steam that is generated at that location and, preferably, recalculate the condensate. Unlike heat pipes, which are passive in that they employ the capillary action of water in conjunction with wicks to transport water, the circulation subsystem comprises compressors, condensers, and pumps to transport water. Consequently, the circulation subsystem can remove large amounts of waste heat compared to heat pipes.

Impinging jets deliver copious amounts of water to the hot surface of the heat transfer plate opposite the side on which the electronic apparatus is disposed preferably in thermal contact with the heat transfer plate. In a preferred embodiment of the present invention, jet impingement of water at a predetermined subatmospheric pressure is employed.

Jet impingement of water is provided on the heat transfer plate at a reduced pressure ranging from partial vacuum to approximately total vacuum. Preferably, the water is jet impinged in a partial vacuum, wherein the temperature associated with the phase change of boiling is lowered to enhance the cooling efficacy.

With the operating temperature of electronic devices required to be at 125° C. or below, and the temperature of the water at approximately 18.3° C., there is a large temperature differential and phase change as the water transforms to steam to effect heat removal and cooling as the steam is circulated by the circulation subsystem away from the heat transfer plate. In addition, the jet impingement maintains steam bubbles associated with boiling small, resulting in more effective heat transfer. Finally, use of water as a coolant is compatible with cooling systems aboard ships operated by the U.S. Navy, thereby satisfying the apparent desirability and advantage to integrate the cooling system in accordance with the embodiments of the present invention with other cooling systems on a ship (for example, air conditioning systems).

The foregoing and other objects, features, and advantages of the present invention will become more readily apparent from the following detailed description of various embodiments, which proceeds with reference to the accompanying drawing.

BRIEF DESCRIPTION OF THE DRAWING

The various embodiments of the present invention will be described in conjunction with the accompanying figure of the drawing to facilitate an understanding of the present invention. In the drawing:

FIG. 1 is a block diagram of one embodiment of the cooling system in accordance with the present invention employing water that is jet impinged at subatmospheric pressure to effect cooling of electrical apparatus.

DETAILED DESCRIPTION OF THE PREFERRED EMBODIMENTS

The principle underlying the cooling system in accordance with one embodiment of the present invention is the substantial amount of heat that is required to transition water to steam. The cooling system of the present invention therefore pertains to two distinct operating regimes in cooling, namely, the heat absorption incident to heating the water from approximately 18.3° C., for example, and the heat of evaporation incident to the subsequent phase change of water to steam at 100° C. These occur very rapidly when water is employed as a coolant exposed to waste heat on the order of 1,000 W/cm$^2$.

Considered in more detail, each calorie absorbed by water increases the water temperature by 1° C. until the boiling temperature, 100° C., is reached. At this point, the 100° C. temperature remains constant as heat is applied until the boiling water is vaporized to steam.

One gram of liquid water at 100° C. must absorb 540 calories of thermal energy in order to vaporize, forming steam. The 540 calories required to vaporize a gram of water at 100° C. is a relatively large amount of energy, much more than the amount required to bring a gram of ice at absolute zero (−273° C.) to boiling water at 100° C.

It should also be noted that evaporation occurs beneath the surface of water in the boiling process. Bubbles of vapor typically form in the water and are buoyed to the surface, where they escape. Bubbles form at the boiling temperature, when the pressure of the vapor within them is great enough to resist the pressure exerted by the surrounding liquid phase water, which is determined in part by the atmospheric pressure. Lowering the pressure lowers the boiling temperature.

The embodiments in accordance with the present invention provide a cooling system implementing a novel thermal management method to remove waste heat from electrical apparatus and/or electronic devices, such as power semiconductors, with heat flux densities on the order of 1,000 W/cm$^2$. The embodiments of the present invention also maintain the semiconductor junctions at 125° C. or below with no waste heat added into the workspace.

The cooling system for removing waste heat from electronic devices using jet impinged water at subatmospheric pressure will be described below. In the case of a ship, facilities water can be used.

The high flux heat removal cooling system in accordance with various embodiments of the present invention will now be described in conjunction with FIG. 1. FIG. 1 shows the basic vapor-compression cycle provided by the cooling system.

The preferred embodiment in accordance with the present invention makes use of water at a predetermined subatmospheric pressure. Preferably, the water is deionized water that is evacuated of dissolved gasses and has a resistivity greater than approximately 1.0 megohm. The particular vapor-compression cycle of the cooling system shown in FIG. 1 is a high waste heat removal cycle employing active components including an array of spray nozzles, an evacuator, and a condenser.

For applications requiring extremely high heat removal rates in a continuous duty cycle, the preferred embodiment of the active high flux heat removal cooling system in accordance with the present invention illustrates an application using cool water having a temperature ranging from approximately 10° C. to 20° C. and more typically in the range of 12.7° C. to 18.3° C. In a preferred embodiment, the cooling system is operated at subatmospheric pressure below 1.0 bar in the range from approximately 0.0 (for example, above 0.08859 psia at which water becomes metastable) to approximately 1.0 bar, and preferably at approximately 0.36 psia, to reduce the boiling point of the water. A reduced boiling point allows more flexibility in choosing the material used to shield the electrical apparatus from direct contact with the water.

The enthalpy of water having a temperature of 18.3° C. at a pressure of 0.36292 psia heated to 21.1° C. is 38.052 BTU/lb. The water will boil on contact with the hot heat transfer plate at 21.1° C. at the reduced pressure. The enthalpy of evaporation of water is 1,054 BTU/lb. Since the objective is to remove 1,000 watts of waste heat per $cm_2$, this is equivalent to removing 0.948 BTU/sec/$cm^2$. That is, the heat generation at 1,000 W/$cm^2$ can be converted to BTU/sec/$cm^2$, as follows.

One (1) BTU equals 1,055 Joules; and 1,000 Watts equals 1,000 Joules/sec. Now, 1,000 J/sec times 1 BTU/1,055 Joules equals 0.948 BTU/sec/$cm^2$. If one gram of water were to be heated from 18.3° C. at a pressure of 0.36292 psia and boil into one gram of steam per second, it would absorb 2.41 BTU/sec. So, the heat transfer for water at 18.3° C. at a pressure of 0.36292 psia, for which the heating to boiling plus heat of vaporization is 38.052 BTU/lb plus 1,054 BTU/lb, is 1,092.1 BTU/lb×1 lb/453.59 grams equals 2.41 BTU/sec. Consequently, in order to remove 1,000 W/$cm^2$, 0.39 grams of water per $cm^2$ must be vaporized per second to remove the waste heat.

The challenge posed by the need to conduct waste heat on the order of 1,000 W/$cm^2$ from the electronic apparatus to the water requires that approximately 0.41 grams of water per $cm_2$ must be vaporized per second to remove the waste heat. In accordance with one preferred embodiment of the present invention, the cooling system employs water to provide more than 1,054 BTU/sec per 0.41 grams of water flowing with an inlet temperature of approximately 18.3° C. and a boiling point of 21.1° C. in a partial vacuum of approximately 0.36 psia, as shown in FIG. 1.

As shown in FIG. 1, the cooling system comprises a heat transfer plate 10 consisting of copper, aluminum, silver, or another suitable thermally conductive material, such as beryllium oxide ceramic, boron nitride, aluminum oxide ceramic, or diamond, with high tensile strength, to enable efficient heat transfer by thermal conduction. The external electrical apparatus, for example, electronic devices, that generate the input heat flux indicated in FIG. 1, are disposed in heat transfer relationship with the heat transfer plate 10, for example, the electrical apparatus can be mounted in thermal contact with the heat transfer plate. Preferably, the heat transfer plate 10 is thin to maximize the thermal gradient and avoid heat stored in the heat transfer plate. Preferably, the thickness of the heat transfer plate 10 is on the order of approximately 1.0 to 4.0 millimeters and has a thickness that is the minimum thickness that enables the heat transfer plate to provide the structural portion of the circulation subsystem at the location at which the water removes high heat flux from the heat transfer plate.

In the preferred embodiment in accordance with the present invention in which the cooling system is operated at subatmospheric pressure, the heat transfer plate 10 comprises all or a portion of a wall of a vacuum tank 12. The heat transfer plate 10 must have sufficient structural integrity to withstand external atmospheric pressure. Because the heat transfer plate 10 forms a portion of the cooling system, in order to have a heat transfer plate thin enough to provide effective heat transfer, the heat transfer plate can be internally reinforced, for example, by means of a honeycomb material 14, to prevent implosion under atmospheric pressure, because the cooling system is operated at subatmospheric pressure. If the honeycomb material 14 is used for reinforcement, jets of water are preferably directed at the centers of the honeycomb openings to optimize heat transfer efficiency.

Honeycomb material 14 attached to the heat transfer plate 10, if designed with optimal jet spacing as the controlling factor, may help increase the heat transfer rate via the finning effect and by controlling the allocation of a portion of the hot surface to each jet flow. A series of parallel slots may also be beneficial, with some slots dedicated to vapor removal and sized appropriately.

As shown in FIG. 1, the cooling system further comprises a liquid reservoir 14. An outlet located proximate the bottom of the liquid reservoir 14 is connected through a pipe 16 to a metering control valve 18 that delivers the water through a pipe 20 from the liquid reservoir to an array of nozzles 22 that cause jet impingement of the water on the heat transfer plate 10. The metering control valve 18 can be a flow control valve that employs variable orifice metering or a pulsewidth modulated solenoid valve having an open/close duty cycle of 0–100%.

The heat transfer plate 10 is constructed of a suitable material with high heat conductivity. Materials such as copper or aluminum are preferred. If, however, an electrically insulating material is needed, then diamond, beryllium oxide ceramic, boron nitride, or aluminum nitride ceramic can be used. The material may be chosen by tensile strength to heat conductivity ratio. The thicker the heat transfer plate 10, the lower the temperature on the cooled side must be. When using a higher boiling point, the thickness of the heat transfer plate 10 would be correspondingly reduced. Maximizing exposed surface area of the cooled side of the heat transfer plate 10 by judicious use of finning is preferred in order to increase surface area and increase cooling efficiency.

The array of nozzles 22 can comprise relatively large aperture nozzles through which the water can be supplied at low pressure resulting from the pressure differential provided by the partial vacuum in the vacuum tank 12. For example, the array of nozzles 22 can comprise a matrix of pressure jet nozzles with each nozzle having a diameter of approximately 2 millimeters.

Heat transfer in the impingement zone of single phase jets of water has been extensively studied. Some important features worthy of note are: a) heat transfer increases with jet Reynolds number (for a fixed diameter nozzle for increasing flow rate);

b) the peak heat transfer rate occurs in a ring having a radius approximately twice the nozzle diameter and falls rapidly with radius thereafter; and c) the optimal gap between the nozzle exit and the target heat transfer plate 10 is between 6 and 8 nozzle diameters. It was noted that maximum heat transfer rates occur in specific annular regions in the impact zone, and it is possible to further improve the heat transfer rates of impinging jets by introducing effects, which move this zone over the surface. For example, pulsing jets have been demonstrated to improve heat transfer by as much as 30% compared to non-pulsing jets. Swirling jets are also effective in enhancing the surface heat transfer, increases being related to the degree of angular momentum imparted to the jet at the cost of increased pressure drop. Notwithstanding that water jets are commonly used to cool (by boiling) strip steel emerging from rolling mills, the heat flux limits of such systems are unknown. Little effort has been made to maximize the heat flux removal in such systems. There is little design information available for the use of jet arrays of liquid that boil on the surface producing a counter flow of vapor, as provided by the cooling system in accordance with the various embodiments of the present invention.

For flat surfaces, a carefully arranged array of round nozzles can be more effective than a slot nozzle system for a given mass flow of water, but depending on the geometry of the surface to be cooled, slots can be superior. In one contemplated modification, impinging jets of high pressure gas (for example, steam, air, nitrogen, or other suitable gas) can be employed to provide increased atomization.

The metering control valve 18 can be controlled by a controller 24 to provide continuous or a pulsewidth modulated proportional jet operation by the array of nozzles 22. It should be noted that high-speed jets can cause cavitation and erosion of metals. (The leading edges of aircraft wings are damaged in this way when they fly through rainstorms.) This sets an upper limit on jet speed and has material property implications such that the choice of material for the heat transfer plate 10 and the design of the heat transfer plate are both important when using water.

At the top of the vacuum tank 12, a vacuum pump/compressor 34 evacuates the vacuum tank 12 to a predetermined reduced pressure, for example, a partial vacuum of approximately 0.36 psia. A consequence of employing water as the coolant is that the compressor of the vacuum pump/compressor 34 shown in FIG. 1 should not use oil as a lubricant. The water will wash the oil away. Dry lubricants or water/steam should be considered as alternative lubricants.

The steam resulting from boiling of the water is discharged by the vacuum pump/compressor 34 and is preferably condensed by a condenser 36 connected to a cooling water supply 38. Additionally, the condensate flows through a pipe 42 that preferably connects to a refrigerated chiller 44, for example, a Flow-Thru R-134A chiller, if the condenser is inadequate to cool the water recirculated to the liquid reservoir 14 to approximately 18.3° C. For example, the cooling water for the condenser 36 must be less than approximately 12.7° C. In the case in which the cooling system comprises the refrigerated chiller 44, the cooling water supply 38 is also preferably used to cool the compressor (not shown) of the refrigerated chiller. The cooled condensate from the condenser 36, or from the refrigerated chiller 44, is recirculated to the liquid reservoir 14 through a pipe 46 to an inlet proximate the top of the liquid reservoir.

The controller 24 controls the metering control valve 18 to adjust the flow from the liquid reservoir 14 to the array of nozzles 22 for varying thermal loads. Finally, an inlet 48 is provided at the top of the liquid reservoir 14 to initially charge the cooling system with water or to add water during operation.

In operation, the active vapor-compression cycle cooling system shown in FIG. 1, employing water that is jet impinged by the array of nozzles 22 on the heat transfer plate 10 within the vacuum tank 12, provides an efficient high flux heat removal system. Heat is removed from the primary heat source, such as semiconductor modules, thermally coupled with the heat transfer plate 10, by the heat of vaporization of the water. The water stored in the liquid reservoir 14 flows to the array of nozzles 22 as and when required. The heat absorbed by the water, causing the water to undergo a phase change to steam, is dissipated to the environment via the condenser 36 before the water is returned to the liquid reservoir 14. The final step in rejecting the heat to the environment, for example, can be by facilities water either used directly as the cooling water supply 38, or through heat transfer panels (not shown) built in to the side of the ship, assuming that enough surface area exists.

The cooling system in accordance with the present invention enables improved cooling of electrical apparatus that generates substantial waste heat, for example, waste heat on the order of 1,000 W/cm$^2$. While various embodiments of the cooling system of the present invention and various contemplated modifications have been described above, other modifications and variations will likely occur to those persons skilled in the art. The cooling system can advantageously be easily integrated within overall ship cooling services. The foregoing description of the embodiments of the present invention is therefore exemplary and not limited to the specific embodiments that are disclosed above. The scope of the invention can only be ascertained with reference to the appended claims and the equivalents thereof.

What is claimed is:

1. A cooling system for thermally conducting and removing high heat flux waste heat from electrical apparatus, comprising:
    water at a predetermined pressure;
    a heat transfer plate having a first side thermally coupled with the electrical apparatus, the heat transfer plate being constructed from a thermally conductive material with high tensile strength, to enable efficient heat transfer by thermal conduction;
    a circulation subsystem that contains the water, the heat transfer plate comprising a structural component of the circulation subsystem;
    means for impinging the water on a second side of the heat transfer plate opposite the side on which the electronic apparatus is disposed;
    a vacuum tank housing the means for impinging the water on the second side of the heat transfer plate; and
    a vacuum pump connected to the vacuum tank for creating a vacuum in the vacuum tank, wherein the predetermined pressure is a subatmospheric pressure, whereby the temperature associated with the phase change of boiling is lowered;
    wherein the subatmospheric pressure is approximately 0.36 psia and the boiling point is approximately 21.1° C. and the inlet temperature of the water is approximately 18.3° C.

2. The cooling system according to claim 1 wherein the heat transfer plate comprises a thermally conductive material selected from among the group consisting of copper, aluminum, silver, beryllium oxide ceramic, boron nitride, aluminum nitride ceramic, and diamond.

3. The cooling system according to claim 2 wherein the heat transfer plate has a thickness of approximately one to four millimeters.

4. The cooling system according to claim 1 wherein the means for impinging the water on the second side of the heat transfer plate comprises one or more nozzles that provide jet impingement of the water on the heat transfer plate.

5. A cooling system for thermally conducting and removing high heat flux waste heat from electrical apparatus, comprising:
    water at a predetermined pressure;
    a heat transfer plate having a first side thermally coupled with the electrical apparatus, the heat transfer plate being constructed from a thermally conductive material with high tensile strength, to enable efficient heat transfer by thermal conduction;
    a circulation subsystem that contains the water, the heat transfer plate comprising a structural component of the circulation subsystem;
    means for impinging the water on a second side of the heat transfer plate opposite the side on which the electronic apparatus is disposed;
    a vacuum tank housing the means for impinging the water on the second side of the heat transfer plate;

a vacuum pump connected to the vacuum tank for creating a vacuum in the vacuum tank, wherein the predetermined pressure is a subatmospheric pressure, whereby the temperature associated with the phase change of boiling is lowered; and honeycomb material affixed to the heat transfer plate to reinforce the heat transfer plate.

6. The cooling system according to claim 5 wherein the subatmospheric pressure is approximately 0.36 psia and the boiling point is approximately 21.1° C. and the inlet temperature of the water is approximately 18.3° C.

7. A cooling system for thermally conducting and removing high heat flux waste heat from electrical apparatus, comprising:

water at a predetermined pressure;

a heat transfer plate having a first side thermally coupled with the electrical apparatus, the heat transfer plate being constructed from a thermally conductive material with high tensile strength, to enable efficient heat transfer by thermal conduction;

a circulation subsystem that contains the water, the heat transfer plate comprising a structural component of the circulation subsystem;

means for impinging the water on a second side of the heat transfer plate opposite the side on which the electronic apparatus is disposed;

a vacuum tank housing the means for impinging the water on the second side of the heat transfer plate; and a vacuum pump connected to the vacuum tank for creating a vacuum in the vacuum tank, wherein the predetermined pressure is a subatmospheric pressure, whereby the temperature associated with the phase change of boiling is lowered;

a condenser connected to the vacuum pump to condense steam evacuated from the vacuum tank; and a cooling water supply connected to the condenser.

8. The cooling system according to claim 7 wherein the subatmospheric pressure is approximately 0.36 psia and the boiling point is approximately 21.1° C. and the inlet temperature of the water is approximately 18.3° C.

9. A cooling system for thermally conducting and removing high heat flux waste heat from electrical apparatus, comprising:

water at a predetermined pressure;

a heat transfer plate having a first side thermally coupled with the electrical apparatus, the heat transfer plate being constructed from a thermally conductive material with high tensile strength, to enable efficient heat transfer by thermal conduction;

a circulation subsystem that contains the water, the heat transfer plate comprising a structural component of the circulation subsystem;

means for impinging the water on a second side of the heat transfer plate opposite the side on which the electronic apparatus is disposed;

a vacuum tank housing the means for impinging the water on the second side of the heat transfer plate;

a vacuum pump connected to the vacuum tank for creating a vacuum in the vacuum tank, wherein the predetermined pressure is a subatmospheric pressure, whereby the temperature associated with the phase change of boiling is lowered;

a condenser connected to the vacuum pump to condense steam evacuated from the vacuum tank; and a refrigerated chiller connected to the condenser to cool condensate from the condenser.

10. The cooling system according to claim 9, further comprising a cooling water supply connected to the refrigerated chiller.

11. The cooling system according to claim 9, wherein the subatmospheric pressure is approximately 0.36 psia and the boiling point is approximately 21.1° C. and the inlet temperature of the water is approximately 18.3° C.

12. A method for thermally conducting and removing high heat flux waste heat from electrical apparatus, comprising:

providing water at a predetermined pressure;

providing a heat transfer plate having a first side thermally coupled with the electrical apparatus, the heat transfer plate being constructed from a thermally conductive material with high tensile strength, to enable efficient heat transfer by thermal conduction;

impinging the water on a second side of the heat transfer plate opposite the side on which the electronic apparatus is disposed;

providing a vacuum tank housing the means for impinging the water on the second side of the heat transfer plate; and evacuating the vacuum tank for creating a vacuum in the vacuum tank, wherein the predetermined pressure is a subatmospheric pressure, thereby lowering the temperature associated with the phase change of boiling;

wherein the subatmospheric pressure is approximately 0.36 psia and the boiling point is approximately 21.1° C. and the inlet temperature of the water is approximately 18.3° C.

13. The method according to claim 12, further comprising the step of condensing steam evacuated from the vacuum tank.

14. The method according to claim 13, further comprising the step of refrigerating the condensate to cool the condensate.

* * * * *